(12) United States Patent
Qu

(10) Patent No.: US 6,900,523 B2  
(45) Date of Patent: May 31, 2005

(54) TERMINATION STRUCTURE FOR MOSGATED POWER DEVICES

(75) Inventor: Zhijun Qu, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/613,586

(22) Filed: Jul. 2, 2003

(65) Prior Publication Data

US 2004/0004238 A1 Jan. 8, 2004

Related U.S. Application Data

(60) Provisional application No. 60/394,038, filed on Jul. 3, 2002.

(51) Int. Cl.[7] .......................... H01L 29/06; H01L 23/58; H01L 29/76; H01L 29/94; H01L 31/062
(52) U.S. Cl. .................. 257/618; 257/626; 257/646; 257/339; 257/341; 257/342; 257/496; 257/329; 257/330; 257/331
(58) Field of Search ................................ 257/618, 626, 257/646, 339, 341, 342, 496, 329, 330, 331, 213

(56) References Cited

U.S. PATENT DOCUMENTS 6,724,021 B2 * 4/2004 Van Dalen et al. ......... 257/213

* cited by examiner

Primary Examiner—Steven Loke  
(74) Attorney, Agent, or Firm—Ostrolenk, Faber, Gerb & Soffen, LLP

(57) ABSTRACT

The termination of a MOSgated device is formed by a trench bevel which surrounds the active device area. The trench bevel has flat walls which extend into and through the epitaxial layer containing the active area which has a lateral extend equal to or less than the thickness of the epitaxial layer. The surface of the bevel is coated with a resistive film, preferably, an amorphous silicon which connects the device source to the device drain to cause the electric field in the epitaxial silicon to the linearly distributed over the length of the bevel.

10 Claims, 1 Drawing Sheet

TERMINATION STRUCTURE FOR MOSGATED POWER DEVICES

RELATED APPLICATIONS

This application claims the benefit of U.S. Provisional Application No. 60/394,038, filed Jul. 3, 2002.

FIELD OF THE INVENTION

This invention relates to power MOSgated devices and more specifically relates to a novel trench termination for such devices

BACKGROUND OF THE INVENTION

Power MOSgated devices such as power MOSFETs and IGBTs are well known. Such devices may employ a planar or tench type active area but a termination structure is needed to terminate the active area. Such termination structures frequently employ spaced field rings and field plates. These require considerable area of the silicon die, particularly for high voltage devices, and increase the necessary die area. Generally, the termination size is about 3 to 5 times the required junction-receiving epitaxial silicon layer thickness, which increases as a function of blocking voltage capability. Thus, a planar termination requires space to "ramp down" the electric field from the edge of the active area to the device edge. The higher the device voltage is, the larger is the proportion of termination area to die area.

It would be very desirable to reduce the termination area without impacting the reliability of the termination.

BRIEF DESCRIPTION OF THE INVENTION

In accordance with the invention, a trench type bevel is formed at the edge of the active area or the edge of die, the top of the bevel extending downward from the outer periphery of the active area. The bevel may form a V groove bevel in the wafer at the die streets or within the die if the die contains plural active areas which are isolated from one another. Other bevels or trench structures can be used. The surface of the bevel or trench is coated with a thin layer of a high resistance but conductive film such as amorphous silicon which is used to electrically connect the drain and source of the device. As a high drain voltage is applied, in an N channel device for instance, a small leakage current flows through the linear amorphous silicon resistor so that the electrical potential distribution along the termination surface is linearly fixed. This linear voltage distribution along the amorphous silicon ensures that the surface electrical field is lower than the maximum field inside the active area. Thus, the active area will avalanche before the termination avalanches. With this structure, the termination size (width) can be dramatically reduced, typically, to a lateral distance about equal to the epi thickness, or even less. The novel termination also reduces device size overhead, especially for low current devices. The bevel angle can be adjusted to tradeoff the leakage current and termination size.

DETAILED DESCRIPTION OF THE PREFERRED EMBODIMENT

Figure 1:
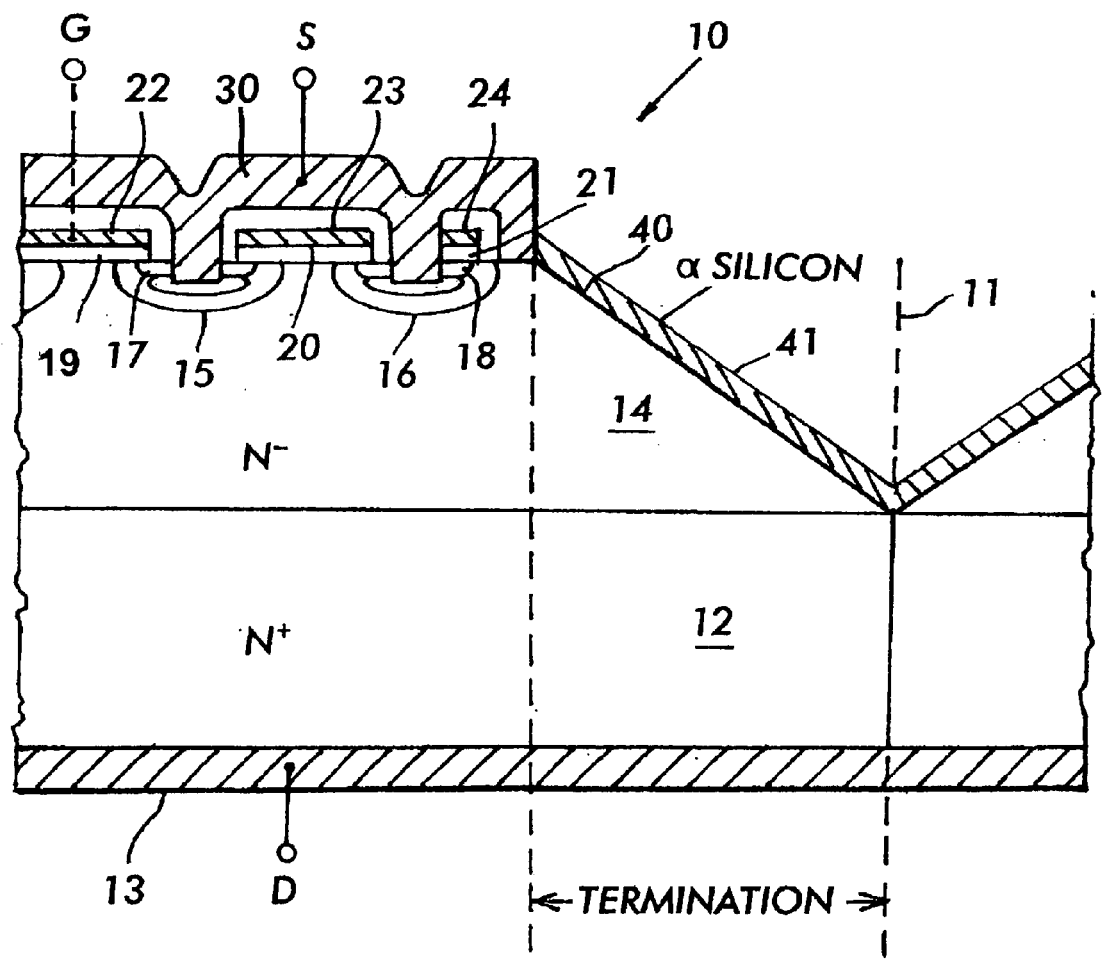
FIG. 1 is a cross-section of a portion of a semiconductor MOSgated device which contains the termination structure of the invention.

Referring to FIG. 1, there is shown, in cross-section a typical planar power MOSFET 10 before singulation from its wafer at street 11. Any other MOSgated device could have been shown, such as an IGBT; and any topology could be used for the active area such as a trench or planar topology.

In the example of FIG. 1, which is an N channel device (a P channel device could also be used with the invention), an $N^+$ silicon body or other substrate 12 is provided as usual, which conventionally receives a conductive drain electrode 13. An epitixially grown $N^-$ layer 14 is conventionally grown atop substrate 12, for receiving the device junctions. The thickness and resistivity of the layer 14 is determined by the reverse voltage to be withstood by the device and are selected as well known. The active area in FIG. 1 contains a well known structure of plural spaced P type base (or channel) diffusion stripes 15, 16 (which could be closed cells, or elements of a trench structure). The channel diffusions 15 and 16 contain conventional $N^+$ source regions 17 and 18 respectively. The invertible channels between the ends of the $N^-$ sources 17 and 18 and the ends of base regions 15 and 16 are covered by a conventional MOSgate structure comprising thin gate oxide layers 19, 20, 21 and polysilicon gate electrodes 22, 23 and 24 respectively. The polysilicon gate electrodes are then insulated as by LTO insulation oxide as usual, and a source electrode 30 is formed on the top surface of the active area.

In accordance with the invention, a bevel 40, which may be a vertical trench or V groove is formed in the silicon wafer, and is coated with a relatively high resistance coating or film 41 which will permit the flow of a small leakage current from drain 13 to source 30 when drain to source voltage is applied to the device. This resistive current path insures the control of the electric field along the length of the bevel 40 and insures that the device breakdown will occur within the active area silicon rather than at the periphery of the die. Preferably, the resistive coating or film 41 is amorphous silicon, but other materials can be used. Thus, Coating 41 can be formed of films including nitrides, oxides, and semi-insulating films like amorphous silicon, sipos, silicon-rich nitride, silicon carbide and the like; and combinations of such materials. Any suitable process can be employed to pattern the windows in these films after their formation and either before or after the fabrication of the MOSgated structure. Film 41 may have any desired, non-critical thickness.

The area required by the termination is drastically reduced, compared to prior planar terminations, and, for example, its lateral extent, labeled "TERMINATION" in FIG. 1 can be less than the thickness of epitaxial region 14. By comparison, prior planar terminations have a lateral extend of 3 to 5 times the thickness of region 14.

The bevel angle can be varied as desired, depending on the device conditions, and can include a trench with vertical walls (at 90° to the upper surface of the wafer to any desired angle less than 90° to the upper surface. The coating 41 can have any desired thickness and conductivity, again depending on device conditions.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A termination for a MOSgated device; said MOSgated device having an epitaxial junction-receiving layer of a given thickness; said epitaxial layer containing an active area and a termination area laterally adjacent said active area; said termination area including a bevel surface having a first edge adjacent to said active area and a second edge adjacent an outer edge of said device; said bevel surface coated with a resistive film for at least approximately linearly distributing the electric field within and along the termination area within said epitaxial layer.

2. The termination claim 1, wherein said termination area has a lateral dimension which is about equal to or less than the thickness of said epitaxial layer.

3. The termination of claim 2, wherein said resistive film is of a material selected from the group consisting of nitrides, oxides, silicon carbide and semi-insulating films including amorphorus silicon, semi-insulating polycrystalline silicon, and silicon-rich nitride.

4. The termination of claim 2, wherein said film is amorphous silicon.

5. The termination of claim 4, wherein said MOSgated device has a source electrode on its top surface and a drain electrode on its bottom surface; said resistive film connecting said source electrode to said drain electrode.

6. The termination at claim 2, wherein said MOSgated device has a source electrode on its top surface and a drain electrode on its bottom surface; said resistive film connecting said source electrode to said drain electrode.

7. The termination of claim 1, wherein said resistive film is of a material selected from the group consisting of nitrides, oxides, silicon carbide and semi-insulating films including amorphorus silicon, semi-insulating polycrystalline silicon, and silicon-rich nitride.

8. The termination of claim 7, wherein said MOSgated device has a source electrode on its top surface and a drain electrode on its bottom surface; said resistive film connecting said source electrode to said drain electrode.

9. The termination of claim 1, wherein said film is amorphous silicon.

10. The termination of claim 1, wherein said MOSgated device has a source electrode on its top surface and a drain electrode on its bottom surface; said resistive film connecting said source electrode to said drain electrode.

* * * * *